(12) United States Patent
Burinskiy et al.

(10) Patent No.: US 7,015,745 B1
(45) Date of Patent: Mar. 21, 2006

(54) APPARATUS AND METHOD FOR SENSING CURRENT IN A POWER TRANSISTOR

(75) Inventors: Alexander Burinskiy, San Jose, CA (US); Luan Vu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/782,513

(22) Filed: Feb. 18, 2004

(51) Int. Cl.
G05F 1/10 (2006.01)
G05F 3/02 (2006.01)

(52) U.S. Cl. .................................. 327/543; 361/93.1
(58) Field of Classification Search ................ 327/538, 327/540–541, 543; 323/315–316; 361/93.1, 361/93.9
See application file for complete search history.

(56) References Cited

U.S. PATENT DOCUMENTS

| | | | |
|---|---|---|---|
| 5,113,089 A | 5/1992 | Osawa | |
| 5,739,712 A * | 4/1998 | Fujii | 327/323 |
| 6,194,957 B1 * | 2/2001 | Fryer et al. | 327/543 |
| 6,194,967 B1 * | 2/2001 | Johnson et al. | 330/288 |
| 6,600,362 B1 | 7/2003 | Gavrila | |
| 6,744,795 B1 * | 6/2004 | Magoon | 372/38.02 |

FOREIGN PATENT DOCUMENTS

JP 2001185964 A * 7/2001

* cited by examiner

Primary Examiner—Quan Tra
(74) Attorney, Agent, or Firm—Darby & Darby PC; Matthew M. Gaffney

(57) ABSTRACT

A circuit for regulating a sensed current in a power transistor is provided. The circuit is configured to sense if the drain current of the power transistor has reached a limit current $I_{limit}$. A sense transistor is arranged in an m:1 current mirror relationship with the power transistor. Additionally, a current sink that is coupled to the drain of the sense current is also configured to sink a current approximately equal to $I_{limit}/m$. Further, a comparison circuit is configured to compare the drain voltages of the power and sense transistors. Also, if the drain current of the power transistor is less than $I_{limit}$, a current sink pulls down the drain of the sense transistor, so that the drain voltage of the sense transistor is less than the drain voltage of the power transistor. However, if the level of the drain current of the power transistor reaches $I_{limit}$, then Vds of the sense transistor would reach Vds of the power transistor, and the comparator would trip. Additionally, two switches are arranged to be open when switching currents flowing through the power transistor and sense transistors are each substantially zero. By opening the switches when these switching currents are each substantially zero, a false output (trip) of the comparison circuit can be prevented.

7 Claims, 2 Drawing Sheets

APPARATUS AND METHOD FOR SENSING CURRENT IN A POWER TRANSISTOR

FIELD OF THE INVENTION

The invention is related to power transistors, and, in particular, to an apparatus and method for sensing current in a power transistor.

BACKGROUND OF THE INVENTION

Current limiting circuits are employed as protection in many applications, such as power regulators, voltage sources, and current sources. Most current limit/protection circuits sense a load current associated with a power transistor for the particular application. Typically, a sense resistor is series-coupled to the load for sensing the load current. However, configuring a sense resistor in series with the load may result in power loss, heat dissipation, and other undesirable conditions.

Other current limiting circuits mirror current flowing through a power MOSFET with a mirror MOSFET. Also, circuitry is employed to substantially reduce the effect of channel modulation on the mirrored current by keeping the power and mirror MOSFETs' drain-source voltages relatively equal. However, extensive current mirroring can introduce undesirable poles into an open loop frequency response of a current limiting circuit. Also, the accuracy of this circuit can be diminished by component mismatch.

BRIEF DESCRIPTION OF THE DRAWINGS

Non-limiting and non-exhaustive embodiments of the present invention are described with reference to the following drawings, in which.

DETAILED DESCRIPTION

Figure 1:
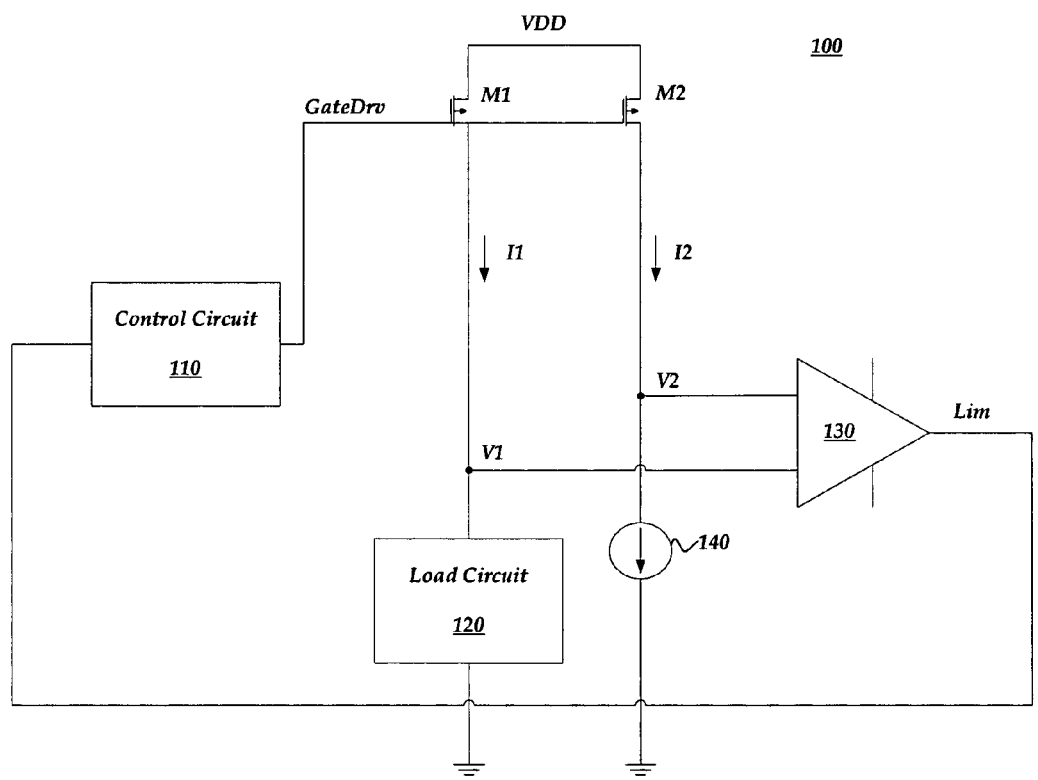
FIG. 1 illustrates a block diagram of an embodiment of a circuit for sensing current in a power regulation circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The term "connected" means a direct electrical connection between the items connected, without any intermediate devices. The phrase "in one embodiment," as used herein does not necessarily refer to the same embodiment, although it may. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to a circuit for regulating a sensed current in a power transistor. The circuit is configured to sense whether the drain current of the power transistor has reached a limit current $I_{limit}$. A sense transistor is arranged in an m:1 current mirror relationship with the power transistor. Additionally, a current sink that is coupled to the drain of the sense current is also configured to sink a current equal to $I_{limit}/m$. Further, a comparison circuit is configured to compare the drain voltages of the power and sense transistors.

In one embodiment, if the drain current of the power transistor is less than $I_{limit}$, a current sink pulls down the drain of the sense transistor, so that the drain voltage of the sense transistor is less than the drain voltage of the power transistor. However, if the level of the drain current of the power transistor reaches $I_{limit}$, then Vds of the sense transistor would reach Vds of the power transistor, and the comparator would trip. The drain current of power transistor could be expressed as follows:

$Id = KW2/L2(Vgs-Vt)(1+\lambda Vds2)$

And the drain current of the power transistor mirror could be expressed as $d = KW1/L1(Vgs-Vt)(1+\lambda Vds1)$, where mW1/L1=W2/L2 is respectively width and length of M1 and M2 and m is mirroring factor. K, Vt, λ are process dependent physical parameters of MOSFET transistors. Vgs–gate source voltage applied to M1, M2 and Vds1, Vds2 are respectively M1's and M2's drain source voltages, where at the trip point Vds1=Vds2. In this way, the current comparison is performed when drain-source voltages of both transistors power and its mirror are equal to each other. Thus, the channel modulation effect can be virtually eliminated without invoking a special circuit to equalize drain-source voltages.

In another embodiment, two switches are arranged to be open when switching currents flowing through the power transistor and sense transistors are each substantially zero. By opening the switches when these switching currents are each substantially zero, a false output (trip) of the comparison circuit can be prevented. Also, when the switches are closed, this circuit can operate in the same way as first described.

FIG. 1 illustrates a block diagram of circuit 100 which may be used for current limitation in a continuous power regulator, or other circuits that employ a power transistor, and the like. Circuit 100 at least includes control circuit 110, load circuit 120, comparator circuit 130, current sink 140, and transistors M1 and M2.

Transistor M1 may be a power transistor, such as a power MOSFET, and the like. Also, transistor M1 may provide current I1 at a drain of transistor M1. Load circuit 120 may receive current I1.

Additionally, transistors M1 and M2 may be configured in an m:1 current mirror arrangement. Transistor M2 may provide current I2 at a drain of transistor M2.

Comparator circuit 130 may compare a voltage associated with the drain of transistor M1 (V1) to another voltage associated with the drain of transistor M2 (V2). Further, comparator circuit 130 may provide a limit signal (Lim) in response to a comparison. Circuit 100 may be arranged such that comparator circuit 100 trips if current I1 reaches a limit current ($I_{limit}$).

Current sink 140 may be configured to sink a current equal to $I_{limit}/m$. If I1 is less than $I_{limit}$, current sink 140 may pull down voltage V2 so that voltage V2 is less than voltage V1. However, if the drain current of the power transistor reaches $I_{limit}$, then V2 may reach V1. If this event occurs, comparator circuit 130 may trip and provide the limit signal (Lim).

Transistors M1 and M2 may be arranged to receive a signal (GateDrv) at their respective gates. Control circuit 110 may provide signal GateDrv. Also, if comparator circuit 130 trips, control circuit 110 may adjust signal GateDrv such that current I1 is kept less than $I_{limit}$. In one embodiment, control circuit 110 is configured to adjust signal GateDrv to turn transistors M1 and M2 off if comparator circuit 130 trips. In another embodiment, control circuit 110 is configured to reduce a voltage associated with signal GateDrv to reduce current I1 if comparator circuit 130 trips.

Control circuit 110 may provide current limiting control, as previously described, and may also provide additional functionality, as explained in greater detail with reference to FIG. 2 below.

Figure 2:
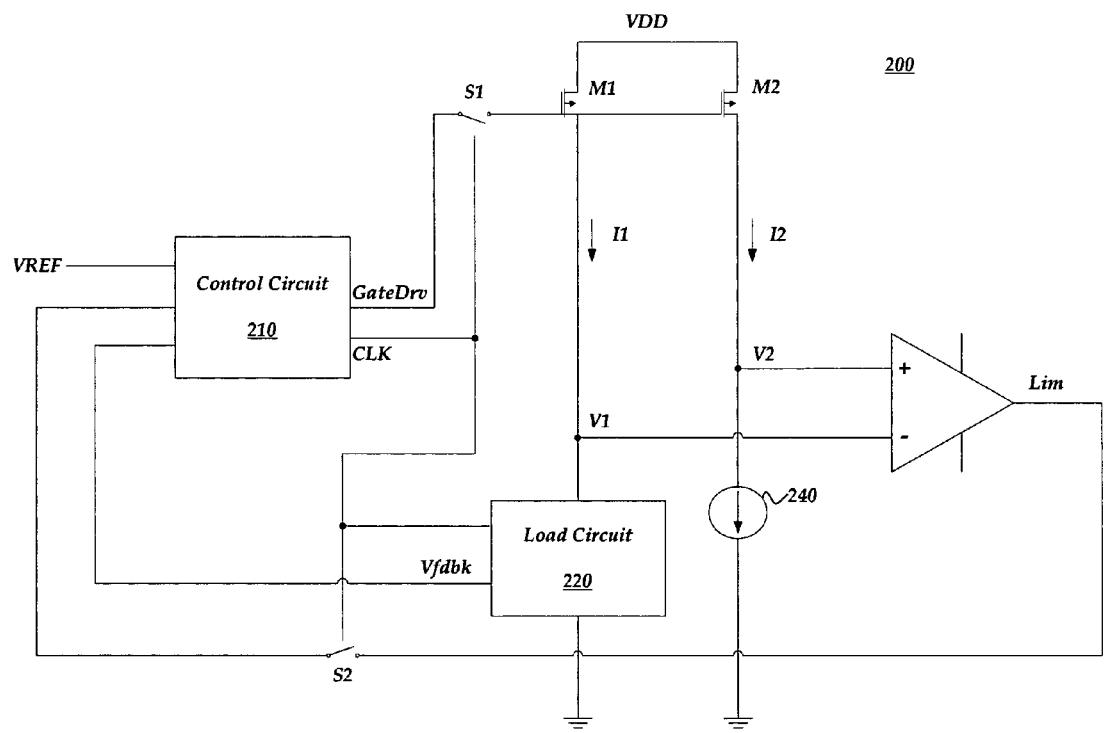
FIG. 2 shows an embodiment of the circuit of FIG. 1 that is arranged for sensing current in a switching power regulation circuit, arranged in accordance with aspects of the present invention.

FIG. 2 shows an embodiment of a circuit (200) that is substantially similar to circuit 100, except that circuit 200 is further arranged for sensing current in a switching power regulator circuit, and the like. Components in circuit 200 may operate in a substantially similar manner as similarly-named components in circuit 100, albeit different in some ways. Circuit 200 may include additional components such as switches S1 and S2.

In circuit 200, currents I1 and I2 may be current pulse signals. Also, load circuit 220 may include switched capacitors, switched inductors, and the like.

Although not shown in FIG. 2, control circuit 220 may include an error amplifier, feedback control responsive to a reference voltage (VREF), feedback voltage (Vfdbk) associated with load circuit 220, and drivers for driving the gates of transistors M1 and M2. These "not shown" components may be arranged to operate in a manner that is substantially similar to their typical use in a switching power regulator circuit.

Switches S1 and S2 may be configured to open and close in response to a clock signal (CLK) that is provided by control circuit 210. In one embodiment, switches S1 and S2 are arranged to be open when currents I1 and I2 are each substantially zero. Because, if switches S1 and S2 were closed when currents I1 and I2 are each substantially zero, comparator circuit 230 could trip even though I1 had not yet reached $I_{limit}$. Thus, by instead opening switches S1 and S2 when currents I1 and I2 are each substantially zero, a false output (trip) of comparator circuit 230 can be prevented.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for current protection, comprising:
   a current mirror arranged with a sense transistor and a power transistor;
   a current sink that is coupled to a drain of the sense transistor, wherein the current sink pulls down a drain voltage of the sense transistor if a current flowing through the power transistor is less than a limit;
   a control component that is arranged to limit the current flowing through the power transistor if the drain voltage of the sense transistor is substantially equivalent to a drain voltage of the power transistor; and
   a clock signal that enables the regulation of a switching current flowing through the power transistor.

2. The circuit of claim 1, further comprising a first switch and a second switch for controlling a switching current that flows through the power transistor, wherein the first switch enables an output of the control component to be coupled to at least the power transistor and the sense transistor and wherein the second switch enables an output from a comparison component to be coupled to the control component, and wherein the comparison component's output indicates if the drain voltage of the sense transistor is substantially equivalent to a drain voltage of the power transistor.

3. The circuit of claim 2, wherein the first switch is arranged in an open state and the second switch is arranged in an open state if the switching current flowing through the power transistor and another switching current flowing through the sense transistor are both substantially equivalent to zero.

4. A circuit for current protection, comprising:
   a current mirror arranged with a sense transistor and a power transistor;
   a current sink that is coupled to a drain of the sense transistor, wherein the current sink pulls down a drain voltage of the sense transistor if a current flowing through the power transistor is less than a limit;
   a control component that is arranged to limit the current flowing through the power transistor if the drain voltage of the sense transistor is substantially equivalent to a drain voltage of the power transistor;
   a comparison component that presents a signal if the drain voltage of the sense transistor is substantially equivalent to the drain voltage of the power transistor; and
   a clock signal that enables the regulation of a switching current flowing through the power transistor.

5. A circuit for current protection, comprising:
   a current mirror arranged with a sense transistor and a power transistor;
   a current sink that is coupled to a drain of the sense transistor, wherein the current sink pulls down a drain voltage of the sense transistor if a current flowing through the power transistor is less than a limit;
   a control component that is arranged to limit the current flowing through the power transistor if the drain voltage of the sense transistor is substantially equivalent to a drain voltage of the power transistor;
   a comparison component that presents a signal if the drain voltage of the sense transistor is substantially equivalent to the drain voltage of the power transistor; and
   a first switch and a second switch for operating with a switching current flowing through the power transistor, wherein the first switch enables an output of the control component to be coupled to at least the power transistor and the sense transistor and wherein the second switch enables signal presented by the comparison component to be coupled to the control component, and wherein the comparison component's signal indicates if the drain voltage of the sense transistor is substantially equivalent to a drain voltage of the power transistor.

6. The circuit of claim 5, wherein the first switch is arranged in an open state and the second switch is arranged in an open state if the switching current flowing through the power transistor and another switching current flowing through the sense transistor are both substantially equivalent to zero.

7. A current protection circuit, comprising:
    a current mirror arranged with a sense transistor and a power transistor;
    a current sink that is coupled to a drain of the sense transistor, wherein the current sink pulls down a drain voltage of the sense transistor if a current flowing through the power transistor is less than a limit; and
    a control component that is arranged to limit the current flowing through the power transistor if the drain voltage of the sense transistor is substantially equivalent to a drain voltage of the power transistor, wherein the control component is further arranged to control the power transistor such that voltage regulation is performed to provide a regulated output voltage based on the control of the power transistor, and wherein the control component includes:
    a comparator that is arranged to trip if a current at the drain of the power transistor reaches the limit current;
    feedback circuitry that is arranged to provide a feedback signal based on the regulated output voltage;
    feedback control circuitry that is arranged to provide feedback control responsive to a reference voltage and the feedback signal; and
    a driver that is arranged to drive the gate of the power transistor.

* * * * *

UNITED STATES PATENT AND TRADEMARK OFFICE
CERTIFICATE OF CORRECTION

| | | |
|---|---|---|
| PATENT NO. | : 7,015,745 B1 | Page 1 of 1 |
| APPLICATION NO. | : 10/782513 | |
| DATED | : March 21, 2006 | |
| INVENTOR(S) | : Alexander Burinskiy et al. | |

It is certified that error appears in the above-identified patent and that said Letters Patent is hereby corrected as shown below:

In the Specification:

First Page Col. 1 (U.S. Patent Documents), Line 6, After "6,744,795" delete "B1" and insert -- B2 --.

First Page Col. 2 (Foreign Patent Documents), Line 1, After "7/2001" insert -- H03F 03/343 --.

Signed and Sealed this

Twenty-second Day of August, 2006

JON W. DUDAS
*Director of the United States Patent and Trademark Office*